(12) United States Patent
Cheymol et al.

(10) Patent No.: US 7,399,981 B2
(45) Date of Patent: Jul. 15, 2008

(54) APPARATUS FOR GENERATING LIGHT IN THE EXTREME ULTRAVIOLET AND USE IN A LIGHT SOURCE FOR EXTREME ULTRAVIOLET LITHOGRAPHY

(75) Inventors: Guy Cheymol, Bures sur Yvette (FR); Philippe Cormont, Le Bouscat (FR); Pierre-Yves Thro, Gif sur Yvette (FR); Olivier Sublemontier, Fontenay aux Roses (FR); Martin Schmidt, Vanves (FR); Benoit Barthod, Naves-Parmelan (FR)

(73) Assignees: Commissariat Energie Atomique, Paris (FR); Alcatel Vacuum Technology France, Paris (FR)

( * ) Notice: Subject to any disclaimer, the term of this patent is extended or adjusted under 35 U.S.C. 154(b) by 307 days.

(21) Appl. No.: 11/151,696

(22) Filed: Jun. 13, 2005

(65) Prior Publication Data
US 2006/0039435 A1 Feb. 23, 2006

(30) Foreign Application Priority Data
Jun. 14, 2004 (FR) .................................. 04 06429

(51) Int. Cl.
*H05G 2/00* (2006.01)
(52) U.S. Cl. ............................... 250/504 R; 250/503.1; 378/119
(58) Field of Classification Search ............. 250/503.1, 250/504, 494.1; 378/119
See application file for complete search history.

(56) References Cited

U.S. PATENT DOCUMENTS 4,063,088 A 12/1977 Dailey
4,704,718 A * 11/1987 Suckewer ...................... 372/5
5,150,253 A * 9/1992 Watanuki .................... 359/360

(Continued)

FOREIGN PATENT DOCUMENTS

EP 1 255 163 A2 11/2002
WO WO 02/085080 10/2002

OTHER PUBLICATIONS

Abe, et al ("Development of a liquid-jet laser-produced-plasma light source for EUV lithography", Proceedings of SPIE vol. 5037 (2003)).*

*Primary Examiner*—Jack I. Berman
*Assistant Examiner*—Michael Maskell
(74) *Attorney, Agent, or Firm*—Weingarten, Schurgin, Gagnebin & Lebovici LLP (57) ABSTRACT

The device comprises a device (2) for creating an essentially linear target (4) in an evacuated space where laser beams (1) are focused, the target being suitable for interacting with the focused laser beams (1) to emit a plasma emitting radiation in the extreme ultraviolet. A receiver device (3) receives the target (4) after it has interacted with the focused laser beams (1), and a collector device (110) collects the EUV radiation emitted by the target (4). The focusing elements (11) for focusing the laser beams on the target (4) are arranged in such a manner that the laser beams (1) are focused on the target (4) laterally, being situated in a common half-space relative to the target (4) and being inclined at a determined angle lying in the range about 60° to about 90° relative to a mean collection axis (6) perpendicular to the target (4). The collector device (110) is disposed symmetrically about the mean collection axis (6) in the half-space containing the laser beams (1) focused on the target (4) and inside a conical space (8) centered on the mean collection axis (6) with a vertex situated at the target (4) and a half-angle at the vertex that is less than the angle of inclination of the focused laser beams (1) relative to the mean collection axis (6). The device is suitable for use as a source for EUV radiation in lithography for fabricating integrated circuits.

24 Claims, 4 Drawing Sheets

U.S. PATENT DOCUMENTS

| | | | |
|---|---|---|---|
| 6,307,913 B1 * | 10/2001 | Foster et al. | 378/34 |
| 6,504,903 B1 * | 1/2003 | Kondo et al. | 378/119 |
| 6,724,465 B2 * | 4/2004 | Babonneau et al. | 355/67 |
| 6,831,963 B2 * | 12/2004 | Richardson | 378/119 |
| 6,862,339 B2 * | 3/2005 | Richardson | 378/119 |
| 6,973,164 B2 * | 12/2005 | Hartlove et al. | 378/119 |
| 2004/0109151 A1 | 6/2004 | Bakker et al. | |
| 2004/0129896 A1 | 7/2004 | Schmidt et al. | |
| 2005/0073663 A1 * | 4/2005 | Miyajima | 355/30 |
| 2007/0058244 A1 * | 3/2007 | Singer | 359/350 |

* cited by examiner

APPARATUS FOR GENERATING LIGHT IN THE EXTREME ULTRAVIOLET AND USE IN A LIGHT SOURCE FOR EXTREME ULTRAVIOLET LITHOGRAPHY

TECHNICAL FIELD

The present invention relates to a device for generating light in the extreme ultraviolet, and to its application to a source for lithography using radiation in the extreme ultraviolet, in particular for fabricating integrated circuits.

In the description below, radiation in the extreme ultraviolet domain (typically covering wavelengths lying in the range 1 nanometer (nm) to 15 nm) is also referred to more simply as "EUV" radiation.

STATE OF THE PRIOR ART

For several tens of years, optical lithography has dominated the fabrication of integrated circuits. It is by continuously evolving that that technique has been able to adapt to market requirements by producing integrated circuits of ever finer resolution. The improvement in resolution has been obtained mainly by using ever shorter wavelengths.

Thus, in the 60s, at the beginning of the microelectronic period, mercury lamps were used, initially at a wavelength of 436 nm, and subsequently at a wavelength of 365 nm. Excimer lasers took over in the 1990s. After KrF laser generation at 248 nm, present practice is to use ArF excimer lasers that emit at a wavelength of 193 nm, thus making it possible to obtain strokes of width, also referred to as the "critical" dimension, of about 130 nm.

Although in the past critical dimensions were longer than the wavelengths used, since the middle of the 1990s and with the introduction of technical tricks, optical lithography is now capable of producing etched patterns of dimensions that are considerably shorter than the wavelength used. In particular, mention can be made of using interferometer techniques, masks that are more and more sophisticated, and projection optics that are more and more precise. It is now envisaged to make integrated circuits with critical dimensions shorter than 50 nm, as compared with 110 nm, which represents the present standard.

To obtain etching with fineness smaller than 50 nm, proposals have been made to introduce lithography in the EUV domain by using sources that emit radiation at a wavelength of 13.5 nm, at a high repetition rate of at least 7 kilohertz (kHz). In general, EUV emission is obtained by creating a plasma that is heated to a suitable electron temperature, of the order of 20 electron volts (eV) to 40 eV. Such a source is said to be "thermal". One of the possibilities under investigation for creating such a plasma is to use one or more laser beams focused on a target in a vacuum. That concept is referred to as a "laser-produced plasma source" or LPP source.

To have an EUV source that is suitable for use industrially, it is nevertheless necessary to ensure that its mean EUV power level is useful, i.e. that power is genuinely usable for lithography, given the losses involved in collecting and transporting EUV radiation, which losses are very high, being of the order of about 100 watts. A large amount of research has been undertaken to increase the useful EUV power from LPP sources for the next generations of photolithographic repeaters. This research has led in particular to an improvement in coupling between lasers and targets, increasing source efficiency defined as the ratio of EUV power generated over electrical power consumed, and finally in optimizing the efficiency with which EUV radiation is collected. It has already been established that it is necessary to inject very high mean laser power, well above 10 kilowatts (kW) in order to obtain sufficient EUV power. This increase in laser power must be accompanied with maintaining laser coupling efficiency with the target (the spatial quality of lasers must not deteriorate with increasing laser power), and while also maintaining maximum efficiency for collecting the EUV radiation emitted by the plasma.

The increase in the power of EUV sources is a crucial point for the viability of such sources in photolithography.

European patent document EP 1 319 988 A2 proposes combining a plurality of EUV sources so as to obtain a source of higher power, however solutions of that type greatly increase cost.

For EUV sources where the plasma is created by laser excitation (LPP sources), it is possible to increase the power of the EUV source by increasing the laser power (e.g. with an infrared laser). As a general rule, the laser power injected onto the target can be increased by using an oscillator together with one or more amplifiers. That gives rise to a laser that is complex, expensive, and generally presenting poor efficiency in converting electricity into light.

For collecting the more or less isotropic EUV radiation emitted by the plasma, European patent document EP 1 255 163 A2 proposes a device with two laser beams that pass through two distinct openings in the first collector element, which is a mirror at normal incidence having a large numerical aperture and located close to the emitting plasma. However, that type of device has maximum reflectivity of only 70% which leads to a large amount of radiation being absorbed, and thus to a high level of thermal stress. In addition, that device presents a lifetime that is limited because the stack of multiple fine layers does not withstand the large amount of debris given off by the plasma.

For an EUV source in which the plasma is created by discharge in a so-called "discharge-produced plasma source" (DPP source), international patent application WO 01/99143 describes one possible embodiment of an EUV radiation collector operating at grazing incidence with an anti-debris filter. That type of device is not normally used with LPP sources.

SUMMARY OF THE INVENTION

An object of the present invention is to remedy the drawbacks of the prior art and to enable an LPP type EUV radiation source to be made with high mean power.

The invention seeks more particularly to enable a plurality of laser beams to be used simultaneously to increase strongly the incident laser power while conserving a device that is effective in collecting EUV radiation and while limiting costs both in fabrication and in use.

These objects are achieved by a device for generating light in the extreme ultraviolet, the device comprising:

a) a plurality of power laser sources for emitting a plurality of laser beams;

b) a focusing device for focusing the laser beams to produce focused laser beams;

c) a device for creating an evacuated space with pressure lower than 1 pascal (Pa) at least in the zone where said focused laser beams are focused;

d) a device for creating a dense target in said space where said focused laser beams are focused, the dense target being suitable for interacting with said focused laser beams to emit a plasma possessing at least one emission line in the extreme ultraviolet;

e) a receiver device for receiving the target after it has interacted with said focused laser beams; and f) at least one first device for collecting the EUV radiation emitted by the target;

the device being characterized in that it has a mean collection axis for EUV radiation that is perpendicular to the axis defined by the essentially linear dense target; in that the focusing device for focusing the laser beams on the target is arranged in such a manner that the laser beams are focused laterally on the target while being situated in a common half-space relative to the target and while being inclined at a predetermined angle lying in the range about 60° to about 90° relative to said mean collection axis; and in that said first collector device is disposed symmetrically about said mean collection axis in the half-space containing the laser beams focused on the target and within a conical space centered on the mean collection axis with its vertex situated on the target and a half-angle at the vertex less than the angle of inclination of the focused laser beams relative to the mean collection axis.

The device for creating an essentially linear dense target may comprise an injector device for creating in a vacuum a filamentary jet, a liquid jet, or a mist of droplets.

The target may also advantageously be constituted by a jet formed by a rapid succession of individual droplets synchronized with the laser pulses. This solution makes it possible to conserve the advantages of a filamentary jet while limiting the quantity of material that is introduced into the vacuum enclosure.

Advantageously, the focused laser beams that are inclined relative to the mean collection axis are disposed in a ring around said mean collection axis.

If the number of laser sources used is large, the inclined focused laser beam may also be distributed in a plurality of rings about the mean collection axis.

The number of focused laser beams, which is greater than or equal to 2, preferably lies in the range 3 to 20.

The focused laser beams may be disposed symmetrically (e.g. in two groups of five focused laser beams) or in non-symmetrical manner (e.g. one group of four focused laser beams on one side and another group of two focused laser beams on the other side) relative to the plane containing the mean collection axis.

The focusing device is designed in such a manner as to produce laser beams focused on small diameters lying in the range about 20 micrometers (μm) to 300 μm.

Nevertheless, in an application of the invention to EUV microscopy and/or tomography in the water transmission window, i.e. in the range 2.3 nm to 4.4 nm, focusing may be performed so as to achieve smallest diameters of down to about 10 μm. This enables the spatial resolution of the microscope to be increased.

In a particular embodiment, the focusing device comprises an optical focusing device for focusing a plurality of power laser beams presenting a product of diameter multiplied by divergence that is several times greater than that of a Gaussian laser beam.

Advantageously, the focusing device comprises at least one mirror which may advantageously be made of a metal or a semiconductor material, such as silicon.

Under such circumstances, a cooling device may be disposed on the rear face(s) of the mirror(s) constituting the focusing device.

According to an advantageous characteristic, the mirror(s) constituting the focusing device is/are ellipsoidal or parabolic in shape, enabling laser beams to pass prior to focusing between the target creator device and the first collector device.

Preferably, the focusing device is disposed in one or more rings around the first collector device.

In a first possible embodiment, the first collector device comprises a device having a multilayer stack of Mo/Si dielectrics at normal incidence.

In another possible embodiment, the first collector device comprises an optical device at grazing incidence presenting a surface of gold, ruthenium, or palladium.

Under such circumstances, the first collector device may comprise first and second interleaved collector elements.

In a first variant, each of the first and second interleaved collector elements presents a shape that is an ellipsoid of revolution about the mean collection axis.

In another variant, the first interleaved collector element is an internal element presenting the shape of an ellipsoid of revolution about the mean collection axis while the second interleaved collector element is an external element presenting in succession, from the end facing the target: the shape of a hyperboloid of revolution followed by the shape of an ellipsoid of revolution (a Wolter lens).

The device of the invention may further comprise a second collector device made symmetrically relative to the mean collection axis in the half-space defined by the target, and not containing the laser beams focused on the target.

Under such circumstances, and advantageously, the second collector device comprises a normal incidence mirror with a multilayer stack having a surface that is spherical.

BRIEF DESCRIPTION OF THE DRAWINGS

Other characteristics and advantages of the invention appear from the following description of particular embodiments given as examples, with reference to the accompanying drawings, in which.

DETAILED DESCRIPTION OF PARTICULAR EMBODIMENTS

Figure 1:
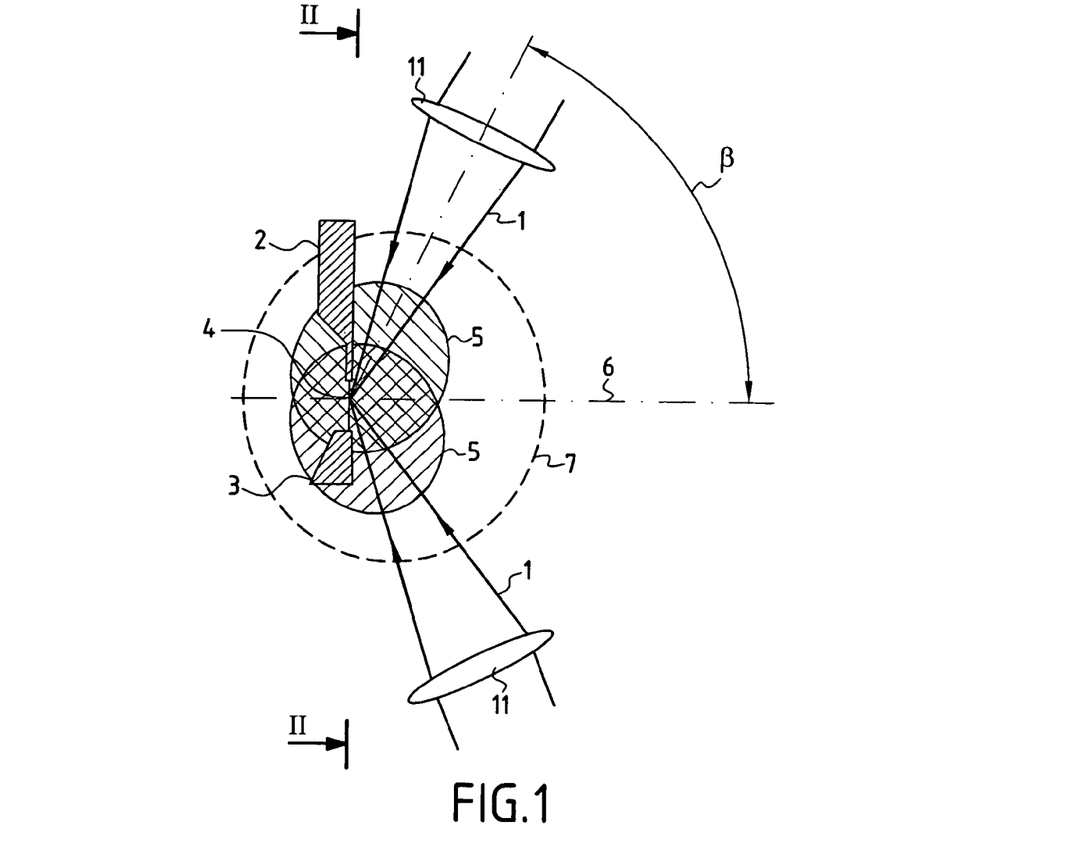
FIG. 1 is a diagrammatic section view on a plane containing the mean collection axis, showing an example of a device for focusing multiple power laser beams onto a target, suitable for use in a device of the invention for generating EUV light.

FIG. 1 shows an injector device 2 adapted to create a filamentary jet or a liquid microjet or a jet of individual droplets (e.g. of a liquefied rare gas such as xenon, or indeed metallic droplets, e.g. lithium or tin) constituting a target 4. The jet created in a vacuum by the injector device 2 is recovered by a receiver device 3.

FIG. 1 shows two power laser beams 1 focused by focusing means 11 such as lenses, diffractive optical devices (e.g. gratings), or indeed mirrors, onto the target 4.

The invention makes use of a number of focused power laser beams 1 that is greater than or equal to 2. Each of the two focused laser beams 1 shown in FIG. 1 is inclined at an angle $\beta$ lying in the range about 60° to about 90° relative to the mean collection axis 6 of the device. In general, a lateral approach for the laser beams 1 focused on the target 4 enables better collection to be achieved of the EUV radiation that is produced.

FIG. 1 shows the EUV emission zone 5 produced by each individual laser beam 1. In general, this EUV emission 5 is centered towards the corresponding incident laser beam 1, but this EUV emission may be quite isotropic, particularly if a target 4 is used that is of the filamentary jet type or of the droplet jet type.

As shown in FIG. 1, when two laser beams 1 are focused laterally onto the target 4, forming an angle $\beta$ relative to the mean collection axis 6 perpendicular to the target 4, each of the two focused beams 1 producing an EUV emission zone 5 results in total EUV emission referenced 7 that presents a maximum along the mean collection axis 6.

Figure 2:
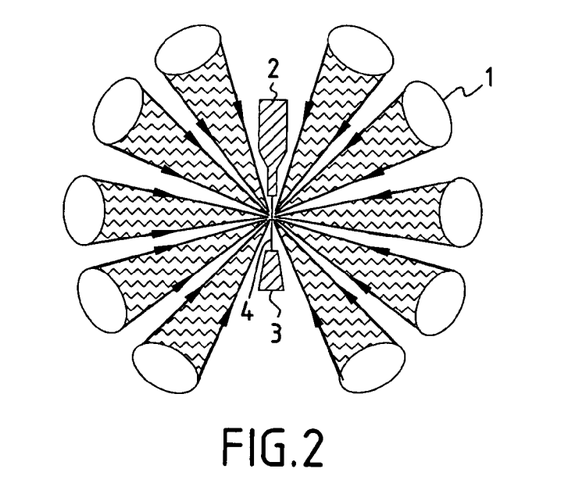
FIG. 2 is a diagrammatic view in section on plane II-II of FIG. 1 perpendicular to the mean collection axis, showing a device for focusing ten power laser beams distributed in a ring in symmetrical manner.

FIG. 2, which corresponds to a cross-section on plane II-II of FIG. 1, shows a set of ten laser beams disposed in a ring symmetrically about the mean collection axis 6 (which is perpendicular to the plane of FIG. 2). All of the laser beams 1 converge on the target 4, being slightly inclined relative to the plane of FIG. 2. The laser beams may be distributed over a plurality of concentric rings. They may also be disposed in a manner that is not symmetrical about a plane containing the mean collection axis 6. It is thus possible, for example, to have two laser beams on one side and four laser beams on the other side.

It can be observed that the resulting emission 7 can differ depending on whether each individual laser beam illuminates the target 4 sufficiently to produce EUV, or whether it is only the superposition of a plurality of laser beams that makes it possible to obtain optimum illumination for EUV emission. In both cases, emission maximum takes place along the direction of the axis 6, but in the second case (superposition required) emission is more concentrated about the mean collection axis 6.

Figure 3:
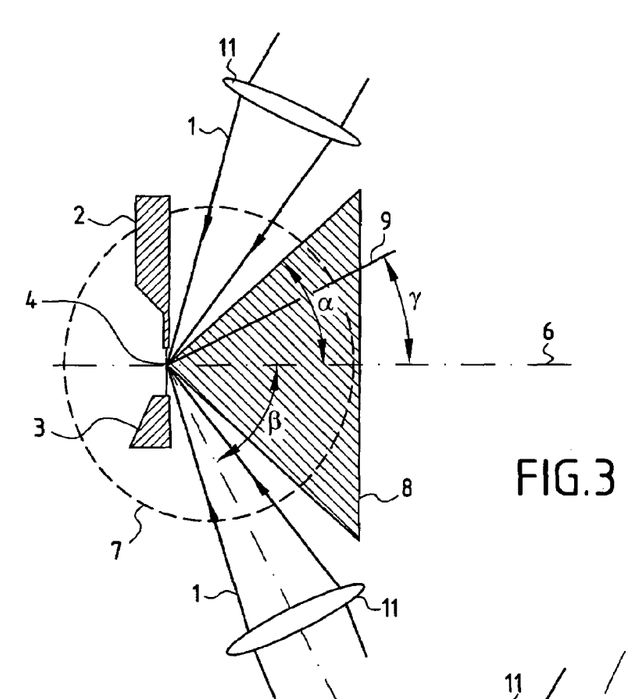
FIG. 3 is a diagrammatic section view analogous to FIG. 1 showing the useful EUV light emission cone coming from the target with which the focused laser beams interact.

FIG. 3 shows a conical zone 8 which is indeed accessible for collecting the EUV radiation 7 when using an emission device of the kind shown in FIGS. 1 and 2. The conical zone 8 has its vertex in the zone where the laser beams 1 are focused on the target 4, and it has as its axis the mean collection axis 6 of the device, presenting a half-angle $\alpha$ at its vertex that constitutes a large potential collection angle (possibly in excess of 60°) since the laser beams 1 present an angle of inclination $\beta$ lying in the range 60° to 90° relative to the mean collection axis 6. By way of example, the angle of inclination $\beta$ may be equal to 75°.

The devices for collecting the EUV radiation produced by the focused laser beams 1 interacting with the target 4 may be designed to pick up radiation 9 oriented at an angle $\gamma$ lying in the range 0 to $\alpha$ relative to the mean collection axis 6 of the device.

Figure 4:
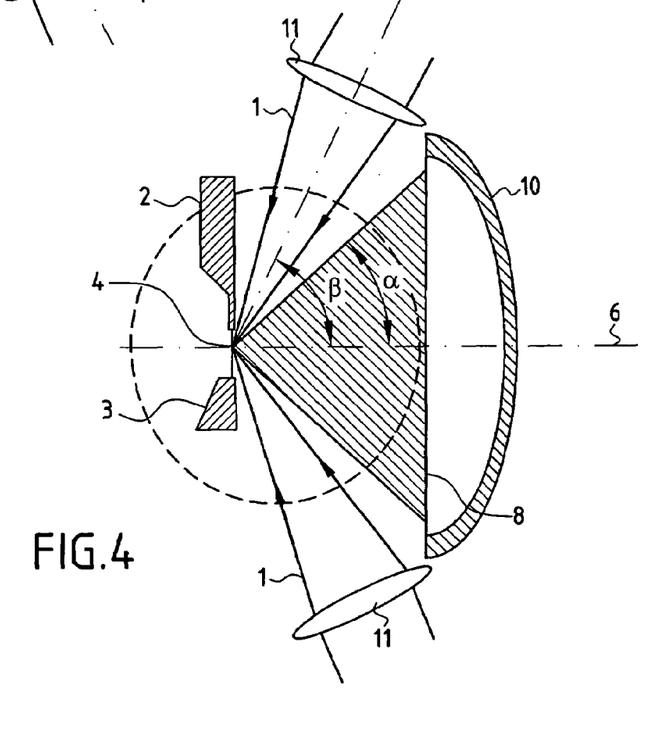
FIG. 4 is a diagrammatic section view analogous to FIG. 3 showing the implementation of a first example of an EUV radiation collector device with normal incidence.

FIG. 4 shows a first example of an EUV radiation collector 10 disposed symmetrically about the mean collection axis 6 in the half-space (relative to the target 4) containing the laser beams 1 focused on the target 4, and within the conical space 8. In the example of FIG. 4, the EUV radiation collector 10 comprises a device made up of multilayer dielectric stacks of Mo and Si at normal incidence.

Multilayer dielectric stacks present maximum reflectivity of 70% in normal incidence and angular acceptance of ±10°, i.e. rays at an angle of incidence of more than 10° have reflectivity of less than 20%.

Figure 5:
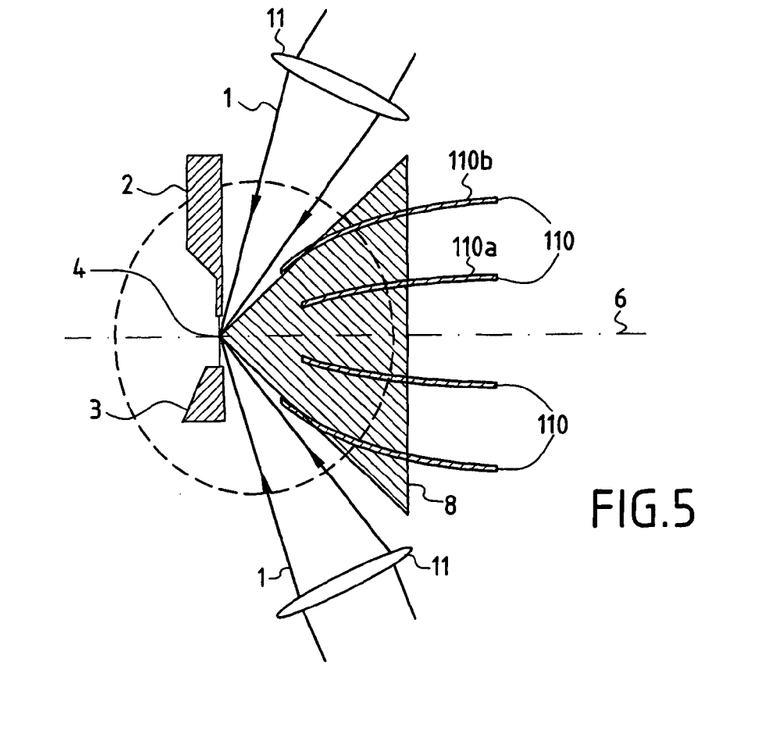
FIG. 5 is a diagrammatic section view analogous to FIG. 3 showing the implementation of a second example of an EUV radiation collector device with grazing incidence and two interleaved collector elements.

FIG. 5 shows a second example of an EUV radiation collector 110 presenting a certain number of advantages over the collector 10 shown in FIG. 4.

The collector device 110 is also disposed symmetrically about the mean collection axis 6 in the half-space relative to the target 4 that contains the laser beams 1 focused on the target 4, and within the conical space 8.

In FIG. 5, the EUV radiation collector 110 is at grazing incidence, and enables reflectivities to be obtained that are greater than those of the collector 10 with similar acceptance angles.

Advantageously, for a collector 110 of grazing incidence, it is possible to use first and second interleaved collector elements 110a, 110b that are symmetrical about the mean collection axis 6.

In a first variant embodiment, each of the two collector elements 110a, 110b is in the form of an ellipsoid of revolution about the mean collection axis 6. Under such circumstances, the collector 110 is efficient for collecting the EUV rays that are emitted by the plasma and that make an angle relative to the mean collection axis 6 of the collector that is less than about 50°.

In order to calculate the collection efficiency depending on aperture, it suffices to combine the equation for the collector surface with the curve giving variation in the reflectivity of the material used as a function of grazing angle. In FIG. 3, $\gamma$ designates the angle made by a ray 9 emitted by the EUV source relative to the mean collection axis 6.

Figure 6:
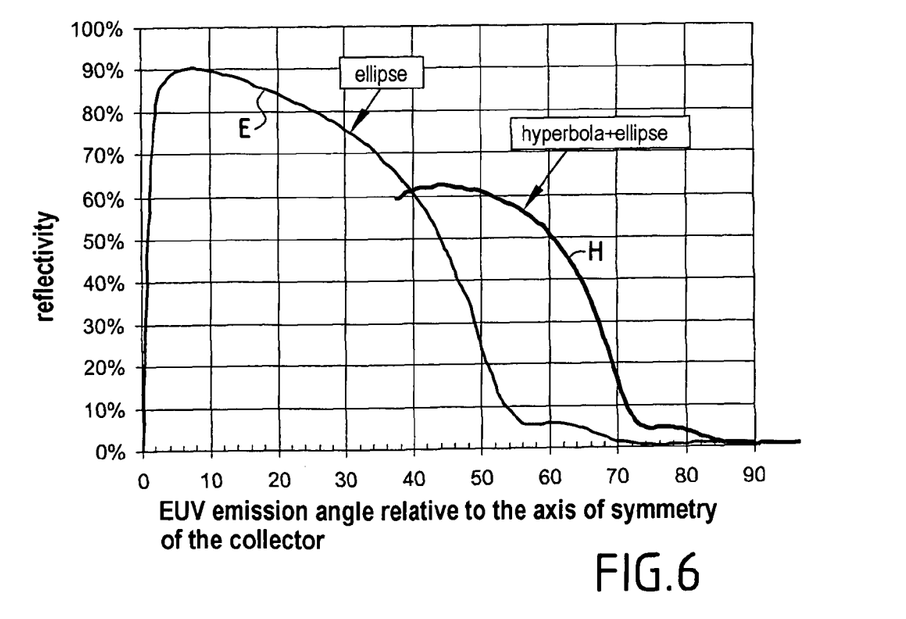
FIG. 6 is a graph showing two curves giving reflectivity as a function of the angle of incidence relative to the surface of the EUV collector, respectively for a single collector element of elliptical shape, and for an additional second collector element of hyperbolic+elliptical shape (corresponding to a Wolter lens)

Curve E in FIG. 6 shows how reflectivity varies as a function of the angle $\gamma$ between the EUV emission and the mean collection axis 6 of the collector, for a collector of the type comprising an ellipsoid of revolution made of ruthenium. This curve E shows that it is possible to collect the EUV emission that makes an angle $\gamma$ lying in the range 0° to 50°. Nevertheless, only 25% of the EUV rays emitted at an angle of 50° are collected.

To increase the collection of rays emitted at an angle $\gamma$ greater than 40°, it is possible to associate an inner element 110a constituted by a collector in the form of an ellipsoid of revolution with an outer element 110b constituted by a Wolter lens. A Wolter lens is a combination of a hyperboloid of revolution (the hyperbolic portion is on the left of the element 110b in FIG. 5) and an ellipsoid of revolution (on the right of the element 110b in FIG. 5). The rays coming from the point source at an angle $\gamma$ greater than 40° are reflected on the hyperboloid and then on the ellipsoid, i.e. there are two reflections on the element 110b. Such a device is known in a different context from U.S. Pat. No. 4,063,088. The advantage of the Wolter lens is that the two reflections take place at small grazing angles where the reflectivity of the material is at its greatest (typically 90%).

Curve H in FIG. 6 shows the reflectivities obtained by an ellipsoidal collector element 110a in association with a collector element 110b that combines a hyperboloid with an ellipsoid. This collector association makes it possible to increase significantly the percentage of EUV rays that are collected. This shows that it is possible to collect efficiently rays emitted at an angle γ that is greater than 60°. Nevertheless, collection becomes relatively ineffective for angles greater than 70°.

It should be observed that a grazing incidence EUV collector like the collector 110, when used in the context of an LPP source, presents the advantage of enabling differential pumping to be used between the vacuum chamber in which the target-forming jet 4 is created and the chamber formed by the collector 110 itself. Differential pumping makes it possible to have a better quality vacuum in the enclosure formed by the collector, and this is highly favorable for transmitting EUV radiation which can then genuinely be used, in particular for application to lithography.

In an embodiment of the invention combining the characteristics shown with reference to FIGS. 2 and 5, it is possible to use optical devices 11 for focusing the laser beams that present large numerical apertures.

This is necessary firstly in order to use power lasers that generally have a product of diameter multiplied by divergence ($M^2$) that is several times greater than that of a Gaussian laser beam, and secondly for the purpose of focusing the laser beams onto small diameters (typically in the range 10 μm to 300 μm) and for achieving levels of illumination of the order of $10^{11}$ watts per square centimeter (W/cm$^2$) to $10^{15}$ W/cm$^2$), which is essential for obtaining the necessary plasma temperatures.

Nevertheless, the device of the invention is not limited to the application to EUV lithography around 13.5 nm. It may also be applied to devices requiring wavelengths that are slightly different, in particular shorter, so long as the selected working frequency is close enough to the range used in EUV lithography for each of the physical phenomena involved to be free from any well-known discontinuity or change of scale.

Thus, for example, microscopy and tomography in the extreme ultraviolet constitute other applications for the extreme ultraviolet light generator device of the invention. They use even shorter wavelengths, in particular situated in the range 2.3 nm to 4.4 nm corresponding to a transmission window in water. Generating wavelengths that are shorter than those used for EUV lithography can be achieved merely by selecting some other emitter material for the target, such as nitrogen, oxygen, or carbon, and by increasing the illumination at the laser focus to values of the order of $10^{13}$ W/cm$^2$ to $10^{15}$ W/cm$^2$. Experience shows that under such circumstances, the temperature $T_e$ required for the plasma is of the order of 40 eV to 200 eV.

The device as obtained in this way is characterized in that the target is constituted by a material suitable for emitting at a wavelength lying in the range 2.3 nm to 4.4 nm, in that the illumination at the laser focus has a value of the order of $10^{13}$ W/cm$^2$ to $10^{15}$ W/cm$^2$, and in that it includes fastener and bonding means for connection to a microscopic or tomographic apparatus that operates in the extreme ultraviolet.

Large-aperture optical focusing systems 11 thus enable a plurality of beams to be combined in three dimensions. Under such circumstances, a plurality of beams coming from laser sources pass through the same optical elements so as to be focused in the same manner on the same point.

As mentioned above, the optical focusing means may be lenses, mirrors, or diffractive optical systems such as gratings. The use of mirrors presents a certain advantage in terms of temperature management since mirrors can be cooled effectively via their rear surfaces. This is not possible with refractive optical means (lenses) or diffractive optical means (gratings) which are suitable for cooling via their edges only.

Figure 7:
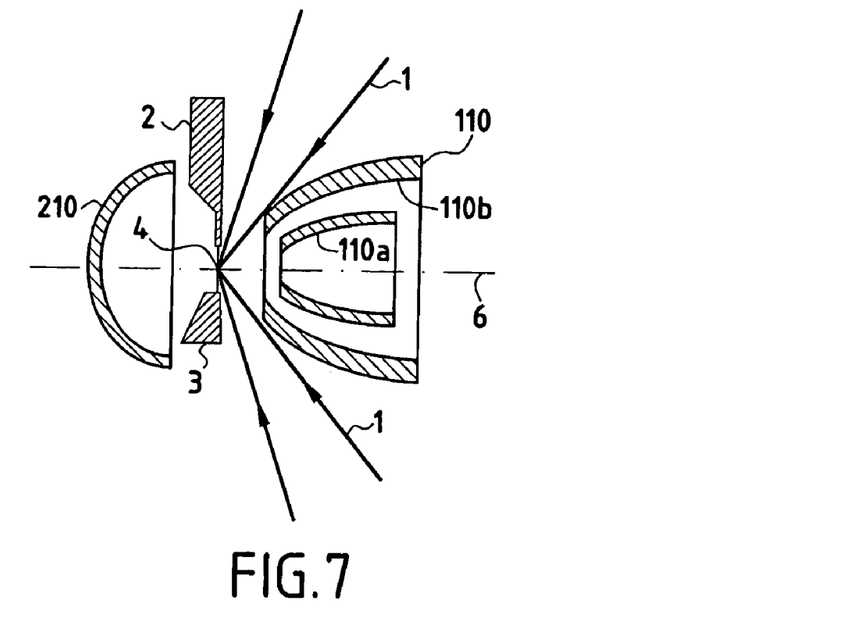
FIG. 7 is a diagrammatic section view on a plane containing the mean collection axis of the device, showing an example of the EUV light generator device of the invention comprising two different EUV radiation collectors situated on either side of the target with which the focused laser beam interacts.

FIG. 7 shows a second particular embodiment in which not only is a collector device 110 of the kind described with reference to FIG. 5 implemented, disposed in the half-space containing the focused laser beams 1 (to the right of the target 4 in FIG. 7), but an additional collector device 210 is also used that is disposed symmetrically about the axis of symmetry 6 in the half-space that does not contain the focused laser beams 1 (to the left of the target 4 in FIG. 7).

By way of example, the additional collector 210 may be a normal incidence mirror comprising a multilayer stack with a spherical surface. The EUV radiation heading towards this mirror 210 is thus reflected into the elements 110a, 110b of the collector 110.

The additional collector 210 operates only with rays at normal incidence (rays coming from the center of curvature that are subsequently reflected back towards said center of curvature), thus making it possible always to have reflectivity of 70%. Also, it is subjected to little damage from debris formed at the outlet from the ejector device 2, since such debris travel mainly towards the laser beams 1.

The embodiment shown in FIG. 7 with a first grazing incidence collector 110 situated on the same side of the target 4 as the focused laser beams 1, and a second normal incidence collector 210 situated on the side of the target 4 that is opposite from the focused laser beams 1, thus constitutes an embodiment that is optimized from the point of view of the effectiveness with which EUV radiation is collected.

The EUV power transmitted to the second focus or to the intermediate focus (constituting the image of the collected source as produced by the collection system) is determined, for various types of collector, by using ray-tracing software. The calculations it performs takes account of the variation in the reflectivity of surfaces as a function of the angle of incidence of the rays. Excellent results are obtained using a layer of ruthenium.

Attacking the target 4 laterally by means of focused laser beams makes it possible to avoid restricting the collection angle, while still having laser beams that focus in the same half-space as that defined by the first collector 10 or 110. The angle of incidence of the laser beams 1 relative to the axis 6 of the collector 10 or 110 thus lies in the range 60° to 90°, approximately.

Another advantage of using a lateral attack is that it makes use of optical focusing systems that are far enough away from the plasma to ensure that their functions are not disturbed by the plasma. It is essential firstly to limit the extent to which the optical focusing systems are heated, and secondly to the extent to which they are damaged. A plasma is both a major source of heat and also a source of charged particles that damage the neighboring surfaces.

Figure 8:
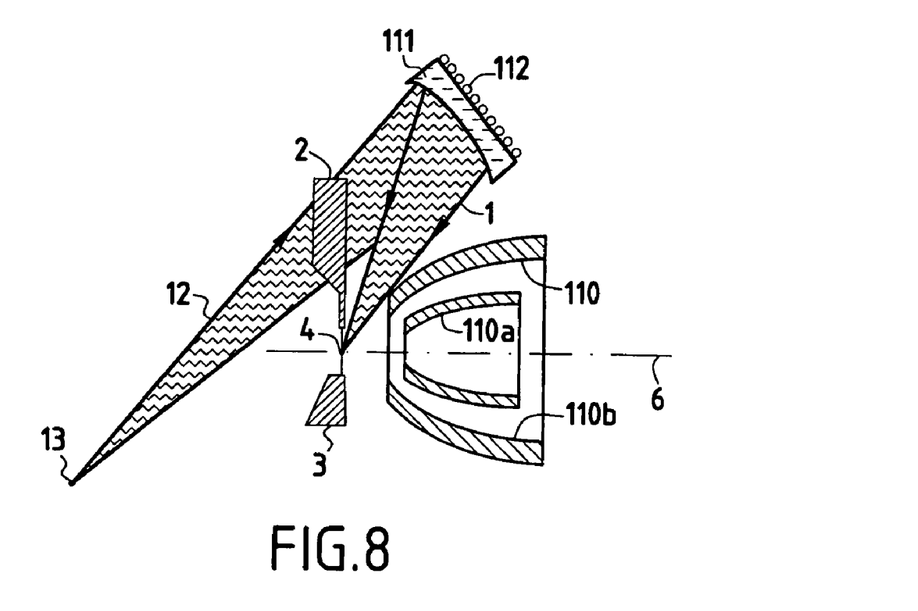
FIG. 8 is a diagrammatic section view on a plane containing the mean collection axis of the device, showing a particular embodiment of an EUV light generator device of the invention using mirror focusing means.

FIG. 8 shows a particular embodiment in which the focusing means comprise mirrors 111.

By way of example, the mirror surface 111 may be in the form of an ellipsoid as shown in FIG. 8. Such mirrors 111 serve firstly to focus the laser beams 1 onto a small diameter, typically 50 μm, and secondly to reduce the size of the laser beams prior to focusing. As a general rule, laser beams are collimated prior to being focused. However, the use of collimated beams is incompatible with implementing an EUV source of the invention, since the beams can then be of large diameter and the space occupied by the various elements of the source does not leave room for passing collimated beams. The structures that enable the target 4 to be created, those that collect the EUV energy, and those that serve to obtain a vacuum in the source enclosure do not make it easy for the laser beams 1 to gain access to the target 4. In contrast, mirrors 111 of ellipsoidal shape make it easy for the laser beams 12 coming from the laser sources 13 and prior to being focused to pass between the components elements of the collector 110 and the components 2, 3 for creating the target 4.

The mirrors 111 also present the advantage of being suitable for cooling via their rear faces using cooling means 112, thus enabling them to be temperature-stabilized and to retain their properties (unlike refractive or diffractive optical systems).

The optical focusing systems may be placed in a ring around the collector 110 (a so-called "spider" configuration).

The ring disposition around the collector 10, 110 presents the advantage of bringing in a large number of laser beams 1 with circular symmetry about the axis 6 defined by the EUV collector 10, 110. This symmetry makes it possible to obtain good uniformity in three dimensions for the illumination and thus for EUV emission, which is a criterion that is important, in particular for photolithography sources. This circular symmetry is required at the intermediate focus in order to be compatible with mask illuminators of the kind that have already been developed.

The present invention providing optimized focusing of a plurality of laser beams for making a high mean power LPP type EUV source enables the incident laser power to be greatly increased and enables the EUV radiation to be collected with as much efficiency as when using a single laser beam, with the EUV radiation collection angle that is effectively available not being decreased by the presence of the optical means for focusing the various laser beams.

The number of laser beams used is greater than or equal to 2, and preferably lies in the range 3 to 20.

The device of the invention is advantageously applied as a light source in the extreme ultraviolet domain for apparatus for performing semiconductor substrate lithography.

The device 2 for creating a target 4 such as filamentary jet, a liquid jet, a mist of droplets, or a jet of individual droplets in a vacuum may comply with the embodiments described, for example, in patent documents WO 02/085080 and WO 01/30122.

For simplification purposes, FIG. 8 does not show directly the power laser source, but reference 13 designates an intermediate focus of the optical system for transporting the beam to the focusing mirror 111.

Selecting to use mirrors 111 made of metal or semiconductor material makes it possible to achieve a good compromise between heat conduction and coefficient of expansion.

The device of the invention is adapted to producing radiation in the extreme ultraviolet in the range 1 nm to 15 nm.

The invention claimed is:

1. A device for generating light in the extreme ultraviolet (EUV), the device comprising:
   a) a plurality of power laser sources for emitting a plurality of laser beams;
   b) a focusing device for focusing the laser beams to produce focused laser beams;
   c) a device for creating an evacuated space with pressure lower than 1 Pa at least in the zone where said focused laser beams are focused;
   d) a device for creating a dense target in said space where said focused laser beams are focused, the dense target being suitable for interacting with said focused laser beams to emit a plasma possessing at least one emission line in the extreme ultraviolet;
   e) a receiver device for receiving the target after it has interacted with said focused laser beams; and
   f) at least one first device for collecting the EUV radiation emitted by the target;
   the device being characterized in that it has a mean collection axis for EUV radiation perpendicular to the axis defined by the essentially linear dense target; in that the focusing device for focusing the laser beams on the target is arranged in such a manner that the laser beams are focused laterally on the target while being situated in a common half-space relative to the target and while being inclined at a predetermined angle ($\beta$) lying in the range about 60° to about 90° relative to said mean collection axis; in that said first collector device is disposed symmetrically about said mean collection axis in the half-space containing the laser beams focused on the target and within a conical space centered on the mean collection axis with its vertex situated on the target and a half-angle ($\alpha$) at the vertex less than the angle of inclination ($\beta$) of the focused laser beams relative to the mean collection axis and in that the number of focused laser beams included therein lies in the range 3 to 20.

2. A device according to claim 1, characterized in that the device for creating an essentially linear dense target comprises an injector device for creating in a vacuum a filamentary jet, a liquid jet, or a mist of droplets, or a jet of individual droplets.

3. A device according to claim 1, characterized in that the focused laser beams that are inclined relative to the mean collection axis are disposed in a ring around the mean collection axis.

4. A device according to claim 1, characterized in that the focused laser beams are disposed in non-symmetrical manner about the mean collection axis.

5. A device according to claim 1, characterized in that the focused laser beams are disposed symmetrically about the mean collection axis.

6. A device according to claim 1, characterized in that the focusing device is designed in such a manner as to produce laser beams focused on small diameters lying in the range about 10 µm to about 300 µm.

7. A device for generating light in the extreme ultraviolet (EUV), the device comprising:
   a) a plurality of power laser sources for emitting a plurality of laser beams;
   b) a focusing device for focusing the laser beams to produce focused laser beams;
   c) a device for creating an evacuated space with pressure lower than 1 Pa at least in the zone where said focused laser beams are focused;
   d) a device for creating a dense target in said space where said focused laser beams are focused, the dense target being suitable for interacting with said focused laser beams to emit a plasma possessing at least one emission line in the extreme ultraviolet;
   e) a receiver device for receiving the target after it has interacted with said focused laser beams; and
   f) at least one first device for collecting the EUV radiation emitted by the target;
   the device being characterized in that it has a mean collection axis for EUV radiation perpendicular to the axis defined by the essentially linear dense target; in that the focusing device for focusing the laser beams on the target is arranged in such a manner that the laser beamss are focused laterally on the target while being situated in a common half-space relative to the target and while being inclined at a predetermined angle ($\beta$) lying in the range about 60° to about 90° relative to said mean collection axis; in that said first collector device is disposed symmetrically about said mean collection axis in the half-space containing the laser beams focused on the target and within a conical space centered on the mean collection axis with its vertex situated on the target and a half-angle (α) at the vertex less than the angle of inclination (β) of the focused laser beams relative to the mean collection axis; and in that the focusing device comprises optical focusing means for focusing a plurality of power laser beams presenting a product of diameter multiplied by divergence that is several times greater than the product of a Gaussian laser beam.

8. A device according to claim 1, characterized in that the focusing device comprises at least one mirror.

9. A device according to claim 8, characterized in that the at least one mirror is made of a semiconductor or metal material.

10. A device according to claim 9, characterized in that the at least one mirror is made of silicon.

11. A device according to claim 8, characterized in that a cooling device is disposed on the rear face of the at least one mirror constituting the focusing device.

12. A device for generating light in the extreme ultraviolet (EUV), the device comprising:
    a) a plurality of power laser sources for emitting a plurality of laser beams;
    b) a focusing device for focusing the laser beams to produce focused laser beams;
    c) a device for creating an evacuated space with pressure lower than 1 Pa at least in the zone where said focused laser beams are focused;
    d) a device for creating a dense target in said space where said focused laser beams are focused, the dense target being suitable for interacting with said focused laser beams to emit a plasma possessing at least one emission line in the extreme ultraviolet;
    e) a receiver device for receiving the target after it has interacted with said focused laser beams; and
    f) at least one first device for collecting the EUV radiation emitted by the target;
    the device being characterized in that it has a mean collection axis for EUV radiation perpendicular to the axis defined by the essentially linear dense target; in that the focusing device for focusing the laser beams on the target is arranged in such a manner that the laser beams are focused laterally on the target while being situated in a common half-space relative to the target and while being inclined at a predetermined angle (β) lying in the range about 60° to about 90° relative to said mean collection axis; in that said first collector device is disposed symmetrically about said mean collection axis in the half-space containing the laser beams focused on the target and within a conical space centered on the mean collection axis with its vertex situated on the target and a half-angle (α) at the vertex less than the angle of inclination (β) of the focused laser beams relative to the mean collection axis, in that the focusing device comprises at least one mirror; and
    in that the at least one mirror constituting the focusing device is ellipsoidal or parabolic shape, suitable for passing laser beams prior to focusing between the device for creating a target and said first collector device.

13. A device according to claim 6, characterized in that the focusing device is itself placed inside the evacuated space.

14. A device according to claim 3, characterized in that the focusing device is disposed in a ring around said first collector device.

15. A device according to claim 1, characterized in that said first collector device comprises a stack of multiple dielectric layers of Mo and Si at normal incidence.

16. A device according to claim 1, characterized in that said first collector device comprises an optical device at grazing incidence presenting a surface of gold, of ruthenium, or of palladium.

17. A device for generating light in the extreme ultraviolet (EUV), the device comprising:
    a) a plurality of power laser sources for emitting a plurality of laser beams;
    b) a focusing device for focusing the laser beams to produce focused laser beams;
    c) a device for creating an evacuated space with pressure lower than 1 Pa at least in the zone where said focused laser beams are focused;
    d) a device for creating a dense target in said space where said focused laser beams are focused, the dense target being suitable for interacting with said focused laser beams to emit a plasma possessing at least one emission line in the extreme ultraviolet;
    e) a receiver device for receiving the target after it has interacted with said focused laser beams; and
    f) at least one first device for collecting the EUV radiation emitted by the target;
    the device being characterized in that it has a mean collection axis for EUV radiation perpendicular to the axis defined by the essentially linear dense target; in that the focusing device for focusing that laser beams on the target is arranged in such a manner that the laser beams are focused laterally on the target while being situated in a common half-space relative to the target and while being inclined at a predetermined angle (β) lying in the range about 60° to about 90° relative to said mean collection axis; in that said first collector device is disposed symmetrically about said mean collection axis in the half-space containing the laser beams focused on the target and within a conical space centered on the mean collection axis with its vertex situated on the target and a half-angle (α) at the vertex less than the angle of inclination (β) of the focused laser beams relative to the mean collection axis, in that said first collector device comprises an optical device at grazing incidence presenting a surface of gold, of ruthenium, or of palladium; and
    in that said first collector device comprises first and second interleaved collector elements.

18. A device according to claim 17, characterized in that each of the first and second interleaved collector elements presents a shape that is an ellipsoid of revolution about the mean collection axis.

19. A device according to claim 17, characterized in that the first interleaved collector element is an inner element presenting the shape of an ellipsoid of revolution about the mean collection axis, while the second interleaved collector element is an outer element presenting in succession starting from an end facing the target: the shape of a hyperboloid of revolution and then the shape of an ellipsoid of revolution.

20. A device for generating light in the extreme ultraviolet (EUV), the device comprising:
    a) a plurality of power laser sources for emitting a plurality of laser beams;
    b) a focusing device for focusing the laser beams to produce focused laser beams;

c) a device for creating an evacuated space with pressure lower than 1 Pa at least in the zone where said focused laser beams are focused;

d) a device for creating a dense target in said space where said focused laser beams are focused, the dense target being suitable for interacting with said focused laser beams to emit a plasma possessing at least one emission line in the extreme ultraviolet;

e) a receiver device, for receiving the target after it has interacted with said focused laser beams; and f) at least one first device for collecting the EUV radiation emitted by the target;

the device being characterized in that it has a mean collection axis for EUV radiation perpendicular to the axis defined by the essentially linear dense target; in that the focusing device for focusing the laser beams on the target is arranged in such a manner that the laser beams are focused laterally on the target while being situated in a common half-space relative to the target and while being inclined at a predetermined angle ($\beta$) lying in the range about 60° to about 90° relative to said mean collection axis; in that said first collector device is disposed symmetrically about said mean collection axis in the half-space containing the laser beams focused on the target and within a conical space centered on the mean collection axis with its vertex situated on the target and a half-angle ($\alpha$) at the vertex less than the angle of inclination ($\beta$) of the focused laser beams relative to the mean collection axis; and in that it further comprises a second collector device disposed symmetrically about the mean collection axis in the half-space defined by the target and not containing the laser beams focused on the target.

21. A device according to claim 20, characterized in that the second collector device comprises a normal incident mirror having a multilayer stack of spherical surface.

22. A device according to claim 1, characterized in that it is adapted to produce radiation in the extreme ultraviolet in the range 1 nm to 15 nm.

23. A device according to claim 1, characterized in that it is applied to an apparatus for semiconductor substrate lithography as a light source in the extreme ultraviolet domain around 13.5 nm.

24. A device for generating light in the extreme ultraviolet (EUV), the device comprising:

a) a plurality of power laser sources for emitting a plurality of laser beams;

b) a focusing device for focusing the laser beams to produce focused laser beams;

c) a device for creating evacuated space with pressure lower than 1 Pa at least in the zone where said focused laser beams are focused;

d) a device for creating a dense target in said space where said focused laser beams are focused, the dense target being suitable for interacting with said focused laser beams to emit a plasma possessing at least one emission line in the extreme ultraviolet;

e) a receiver device for receiving the target after it has interacted with said focused laser beams; and f) at least one first device or collecting the EUV radiation emitted by the target;

the device being characterized in that it has a mean collection axis for EUV radiation perpendicular to the axis defined by the essentially linear dense target; in that the focusing device for focusing the laser beams on the target is arranged in such a manner that the laser beams are focused laterally on the target while being situated in a common half-space relative to the target and while being inclined at a predetermined angle ($\beta$) lying in the range about 60° to about 90° relative to said mean collection axis; in that said first collector device is disposed symmetrically about said mean collection axis in the half-space containing the laser beams focused on the target and within a conical space centered on the mean collection axis with its vertex situated on the target and a half-angle ($\alpha$) at the vertex less than the angle of inclination ($\beta$) of the focused laser beams to the mean collection axis; and in that the target is made of a material suitable for emitting at a wavelength lying in the range 2.3 nm to 4.4 nm, in that the illumination at the laser focus has a value of the order of $10^{13}$ W/cm$^2$ to $10^{15}$ W/cm$^2$, and in that it includes a fastener and connection device for connection to a microscopy or tomography apparatus operating in the extreme ultraviolet.

* * * * *

UNITED STATES PATENT AND TRADEMARK OFFICE
CERTIFICATE OF CORRECTION

| | |
|---|---|
| PATENT NO. | : 7,399,981 B2 |
| APPLICATION NO. | : 11/151696 |
| DATED | : June 13, 2005 |
| INVENTOR(S) | : Guy Cheymol et al. |

It is certified that error appears in the above-identified patent and that said Letters Patent is hereby corrected as shown below:

Column 14, claim 24, line 7, "creating evacuated" should read --creating an evacuated--;

Column 14, claim 24, line 17, "or" should read --for--; and

Column 14, claim 24, line 34 "beams to" should read --beams relative to-- .

Signed and Sealed this

Nineteenth Day of May, 2009

JOHN DOLL
*Acting Director of the United States Patent and Trademark Office*

UNITED STATES PATENT AND TRADEMARK OFFICE
CERTIFICATE OF CORRECTION

PATENT NO.         : 7,399,981 B2
APPLICATION NO. : 11/151696
DATED              : July 15, 2008
INVENTOR(S)        : Guy Cheymol et al.

Page 1 of 1

It is certified that error appears in the above-identified patent and that said Letters Patent is hereby corrected as shown below:

Column 14, claim 24, line 7, "creating evacuated" should read --creating an evacuated--;

Column 14, claim 24, line 17, "or" should read --for--; and

Column 14, claim 24, line 34 "beams to" should read --beams relative to-- .

This certificate supersedes the Certificate of Correction issued May 19, 2009.

Signed and Sealed this

Ninth Day of June, 2009

JOHN DOLL
*Acting Director of the United States Patent and Trademark Office*